United States Patent [19]

Tsaur

[11] Patent Number: 4,864,378
[45] Date of Patent: Sep. 5, 1989

[54] SCHOTTKY BARRIER INFRARED DETECTOR

[75] Inventor: Bor-Yeu Tsaur, Bedford, Mass.

[73] Assignee: Massachusetts Institute of Technology, Cambridge, Mass.

[21] Appl. No.: 111,411

[22] Filed: Oct. 21, 1987

[51] Int. Cl.$^4$ .................. H01L 29/56; H01L 27/14; H01L 35/28

[52] U.S. Cl. .................. 357/30; 357/15; 357/61; 136/255; 427/178

[58] Field of Search .................. 357/15, 30, 61; 136/255; 437/178

[56] References Cited

U.S. PATENT DOCUMENTS 4,398,344 8/1983 Gould .................. 357/15
4,531,055 7/1985 Shepherd, Jr. et al. .................. 250/211
4,533,933 8/1985 Pellegrini et al. .................. 357/15

OTHER PUBLICATIONS

Capone et al., "Evaluation of a Schottky IRCCD Staring Mosaic Focal Plane" 22nd International Technical Sym. SPIE San Diego, pp. 120–131, Aug. 1978.
"Design and Characterization of a Schottky Infrared Charge Coupled Device (IRCCD) Focal Plane Array", Capone et al., Optical Engineering, vol. 21, No. 5, pp. 945–950, (Sep./Oct. 1982).
F. Sheperd and A. Yang, IEDM Tech. Dig., 310–313 (1973).
P. Pellegrini et al., IEDM Tech. Dig., 157–159, (1982), "IrSi Schottky Barrier Diodes for Infrared Detection".
M. Kimata et al., "Platinum Silicide Schottky–Barrier Ir–CCD Image Sensors", Mitsubishi Electric Corp. Technical Research and Development Institute, Japan Defense Agency.
Silverman et al., "Characterization of Thin PtSi/p–Si Schottky Diodes".
"IrSi Schottky–Barrier Infrared Image Sensor", Yutani et al., 124–127, IEDM 87.

Primary Examiner—Eugene R. LaRoche
Assistant Examiner—Michael Shingleton
Attorney, Agent, or Firm—Hamilton, Brook, Smith & Reynolds

[57] ABSTRACT

A method and resultant device is described for fabricating iridium silicide Schottky IR detectors in which a thin intermediate film of platinum is formed between the conventional iridium outer layer over a p-type silicon substrate with or without an n-type guard ring. After thermal treatment, an iridium platinum silicide region is formed in the silicon substrate. The unreated iridium/platinum outside the device region is removed using a dry-etching process.

22 Claims, 3 Drawing Sheets

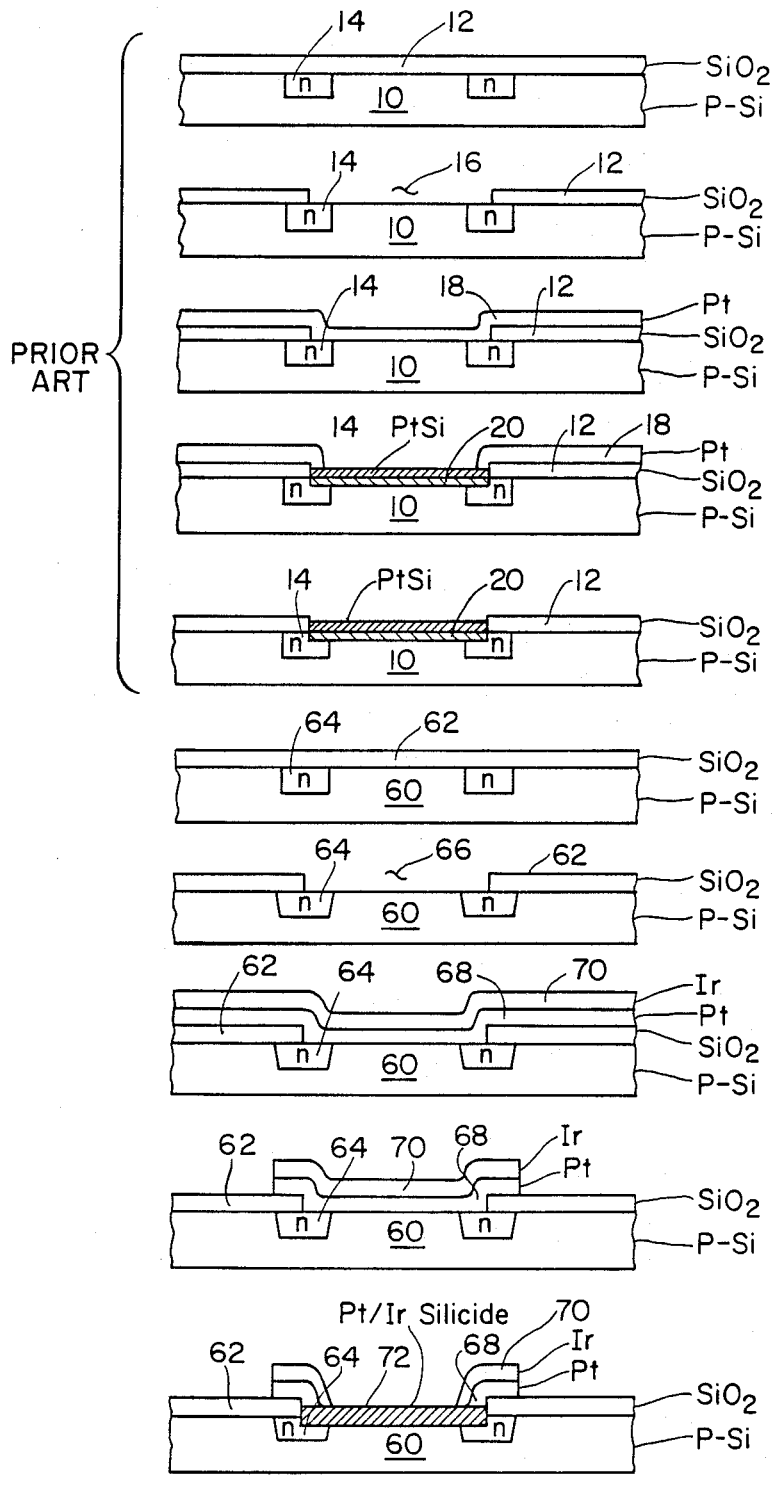

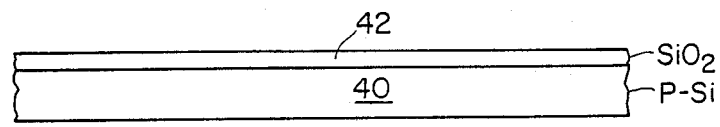
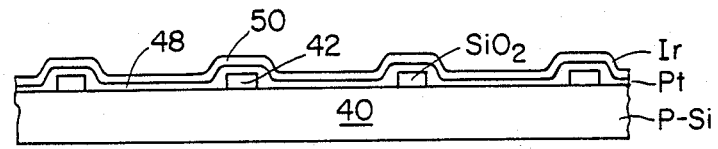
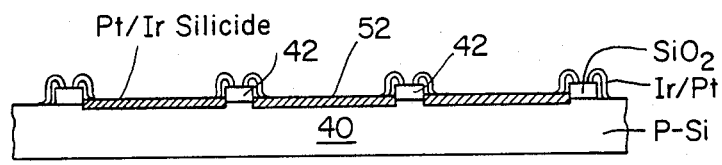
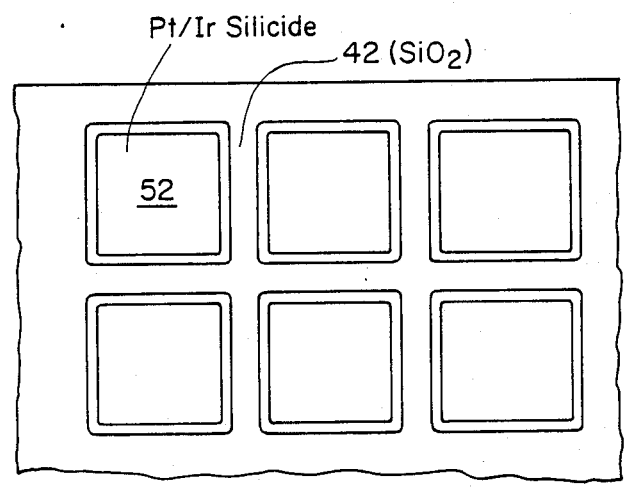
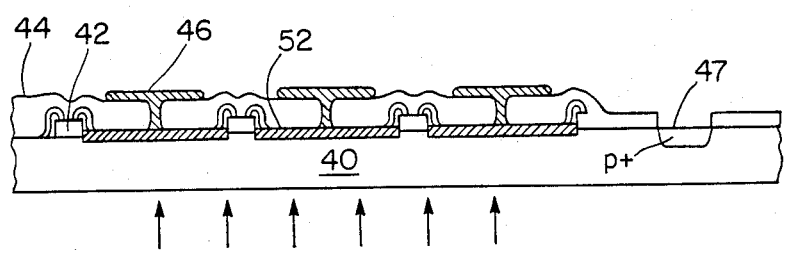

SCHOTTKY BARRIER INFRARED DETECTOR

GOVERNMENT SUPPORT

Work described herein was sponsored by the Department of the Air Force, Contract No. AFF19628-85-C-0002.

BACKGROUND ART

The technology of fabricating Infrared (IR) sensitive silicide Schottky barrier detectors has progressed gradually over the past fourteen years. The first low-barrier-height detectors were made using palladium silicide ($Pd_2Si$) Schottky diodes having a barrier-height of 0.35 eV, corresponding to a detector cutoff wavelength of about 3.5 microns [F. Shepherd, A. Yang, *IEDM Tech. Dig.*, pp. 310–313 (1973)]. The next major breakthrough in low-barrier silicide technology came with the discovery of platinum silicide (PtSi) detectors, which have a barrier height of 0.22 eV, corresponding to a cutoff wavelength of about 5.6 microns [B. Capone et al., 22nd International Technical Sym. SPIE, San Diego, p. 120 (August 1978)]. The PtSi Schottky-barrier detector has evolved to become a mature technology and large-size imaging arrays ontaining more than 250,000 detector elements have been demonstrated using this technology.

There is a strong interest in extending the spectral response of Schottky IR detector further into the long wavelength band from 8 to 12 microns. Experiments have demonstrated [P. Pellegrini, et al. *IEDM Tech. Dig.*, pp. 157–159 (1982)] that iridium silicide has the lowest barrier height on p-type silicon of any known metal. (See, also, U.S. Pat. No. 4,533,933 to Pellegrini et al. for a description of a Schottky barrier diode formed of iridium-silicon material.) Barrier-heights of 0.125–0.152 eV have been measured in iridium-silicide detectors corresponding to a cutoff wavelengths of 8–10 microns. However, detectors fabricated with Ir silicides generally have low quantum efficiencies and irreproducible characteristics. Comparison of reaction kinetics between Pt and Ir metals with silicon indicates that Pt is the dominant diffusion species in the formation of Pt silicide, whereas Si is the dominant diffusion species in the formation of Ir silicide. As a result, Ir silicide formation requires higher temperatures than Pt silicide and exhibits less reproducible characteristics. The presence of interfacial impurities also reduces the efficiency of internal photoemission and, therefore, reduces detector quantum efficiency. Aside from these disadvantages for Ir silicide, fabrication of Ir silicide detectors is also more difficult than that of Pt silicide.

The fabrication procedure for Pt silicide diodes is well established and is outlined in the prior art drawings of FIGS. 1(a)–1(e).

In the first step of the prior art process for the formation of platinum silicide diodes, as shown in FIG. 1(a), an n-type guard ring structure 14 is formed in a p-type silicon substrate 10 in the well-known manner, using n-type dopants, such as phosphorus. Next, an $SiO_2$ oxide layer 12 is formed over the guard ring structure and substrate 14 and 10, respectively, such as by the well-known oxidation or vapor deposition processes.

Next, as shown in FIG. 1(b), a suitable mask (not shown) is placed over the $SiO_2$ film 12 and an opening 16 is etched in the $SiO_2$. This opening extends to about the middle diameter of the n-type guard ring 14 to provide access for the subsequent silicide contact formed on the radially inner edge of the guard ring.

Next, as shown in FIG. 1(c), a thin film of platinum 18 is deposited utilizing, for example, an electron-beam deposition process. The platinum film 18 is deposited over the entire top surface, covering both the $SiO_2$, a radially inner portion of the guard ring 14, and a portion of the silicon substrate 10 beneath the previous opening 16.

Next, as shown in FIG. 1(d), the device is subjected to heat treatment to form a platinum silicide disc-like portion 20 in the $SiO_2$ opening.

Next, the device is wet etched in aqua regia to remove the unreacted platinum 18 on the $SiO_2$ layer 12, as shown in FIG. 1(e).

The above described process is a self-aligned process which has proven to be extremely reproducible and is the key to the successful development of large-size Pt silicide detector arrays. However, the self-aligned process is not adaptable for iridium silicide devices. Iridium is only slightly soluble in aqua regia and reaction of iridium with $SiO_2$ further prevents the removal of iridium. Accordingly, there is a need for the development of a new fabrication procedure for the manufacturing of iridium silicide detector arrays. Furthermore, the new procedure should improve the reproducibility of the silicide formation and increase the quantum efficiency of the silicide detector.

DISCLOSURE OF THE INVENTION

The invention comprises, in general, a process, and resultant product, for fabricating iridium-silicide Schottky barrier detectors. In this process, after formation of the etched opening in the $SiO_2$ layer, a double layer consisting of a thin (about 5 Å) film of Pt, followed by a thin (about 120–20 Å) film of Ir, is formed, as by electron-beam deposition, on the top surface over the exposed Si substrate/guard/ring and $SiO_2$. This structure is then subjected to a dry etching process to remove the Ir/Pt film over the $SiO_2$ using conventional photoresist masking techniques. Then, the structure is heat treated at 300°–600° C. to form an Ir/Pt silicide disc-like region on the exposed Si substrate and guard ring in the $SiO_2$ opening. It should be noted that the dry etching and annealing process can be reversed without affecting the final device structure.

The intermediate Pt layer serves the purpose of "cleaning up" the interface by "dissolving" the interfacial contaminations and native oxides; allowing the silicide reaction to occur reproducibly and uniformly. The resulting Ir/Pt silicide region consists of either a Ir/PtSi or IrSi/PtSi bi-layered structure, or mixture thereof. Since the PtSi layer is very thin, the Schottky barrier height is essentially dominated by the Ir, or Ir silicide.

BRIEF DESCRIPTION OF THE DRAWINGS

FIGS. 1a–1e presents a series of schematic sectional views illustrating the process of forming a prior art PtSi Schottky barrier detector.

FIGS. 2a–2e presents a series of schematic sectional views illustrating the process of forming a Ir/Pt/Si Schottky barrier detector of the present invention.

FIG. 4a–4c presents a series of schematic sectional views illustrating the process of forming an alternate embodiment of the invention.

FIG. 5 is a top view of the structure of FIG. 4c.

FIG. 6 is a schematic sectional view of the contacting process for the device of FIG. 4c.

BEST MODE OF CARRYING OUT THE INVENTION

Figure 3A:
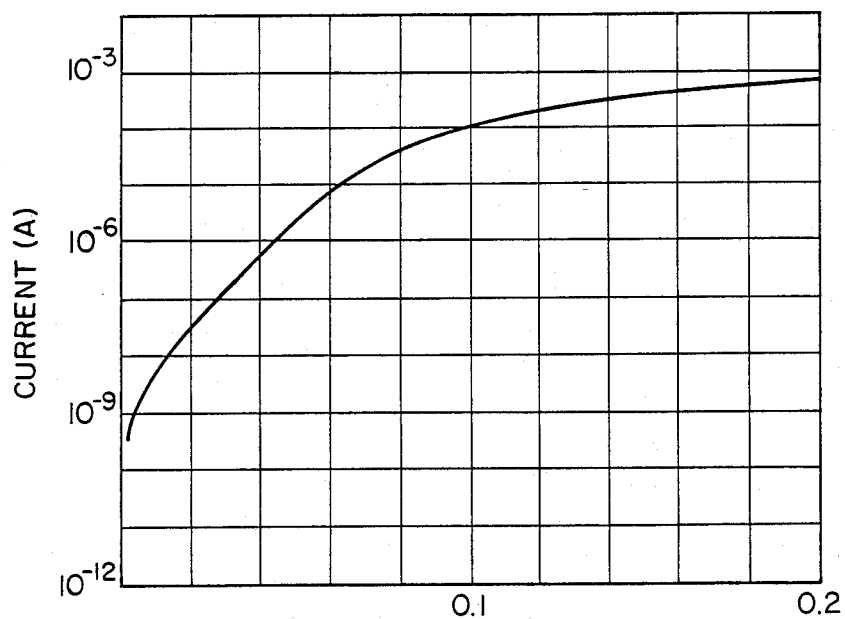
FIG. 3a is a plot of current versus forward voltage of a device made in accordance with the FIGS. 2a–2e of the invention.

The invention will now be described, in detail, in connection with FIGS. 2(a)–2(e).

The first step of the process is identical to that described in connection with FIG. 1(a). An n-type guard ring structure 64 is formed by conventional techniques in a p-type silicon substrate 60 and an SiO₂ layer 62 is formed over the top surface of the guard ring silicon substrate (See FIG. 2(a)). Note: Other insulators, such as silicon nitride, may be used in place of SiO₂.

Next, as shown in FIG. 2(b), an opening 66 is etched in the SiO₂ coating 62 for subsequent silicide contact formation. Again, this is a conventional process identical to that described above in connection with FIG. 1(b).

FIG. 2(c) shows the departure from the prior art process. In this step of the process, first, a thin layer of platinum 68 is deposited over the structure of FIG. 2(b), such as by an electron-beam evaporation process. Layer 68 is preferably in the order of 5 Å thick. Next, a layer of iridium 70 is formed as by the same evaporation process over the platinum layer 68. The iridium layer 70 is preferably in the order of 10–20 Å thick.

Next, as shown in FIG. 2(d), a dry etching process, such as reactive ion etching, or plasma etching, is used to remove the iridium/platinum layers over the SiO₂ layer 68 using a photoresist mask (not shown).

Finally, as shown in FIG. 2(e), the structure formed in FIG. 2(d) is heat treated, preferably at a temperature of 300°–600° C., to form an iridium platinum silicide region 72 at the interface of the previous platinum/silicon substrate and extending to the mid-diameter of the guard ring structure 64. The exact composition of region 72 is difficult to characterize because of the extreme thinness of the Pt layer 68. It is believed to consist of a bi-layer of Ir/Pt silicide or IrSi/PtSi, but may be a mixture of both.

It should be noted that the processes shown in FIGS. 2(d) and 2(e) can be reversed, such that heat treatment is first applied to form the silicides and the unreacted Ir/Pt layer on the SiO₂ are subsequently removed by the dry etching process.

The individual Schottky barrier diodes or cells formed in FIG. 2a–e are each coupled in parallel to charge coupled device CLD gates (not shown) to form a detector array. The CCD gates extract signals from associated detectors.

Current voltage measurements, shown in FIG. 3, indicate that the diodes formed as above are of high quality.

Figure 3B:
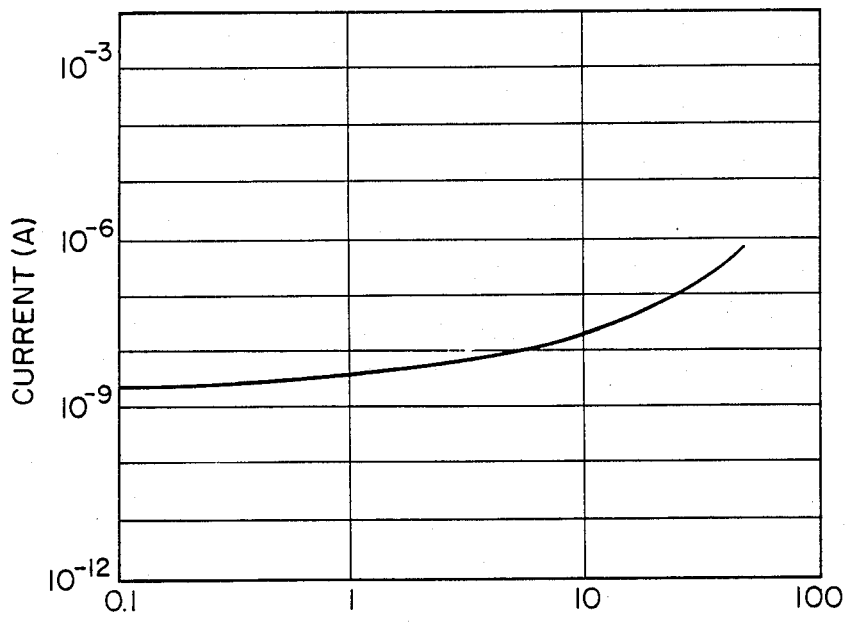
FIG. 3b is a plot of current versus reverse breakdown voltage of the same device.

FIG. 3(a) shows the forward current voltage characteristics of a representative device measured at liquid-nitrogen temperature of about 77° K. The near unity in the diode ideality factor suggests a high quality interface. The reverse characteristics of the device is shown in FIG. 3(b), which shows a diode reverse breakdown voltage in excess of 50 V. The Schottky barrier height deduced from the diode saturation current is about 0.165 electron volts, considerably smaller than that ($\sim$0.22 eV) of Pt silicide diode.

Internal photoemission measurements show that the platinum/iridium devices have higher quantum efficiency (about a factor of 3 higher) over the wavelength range of 1 to 8 microns than the conventional iridium devices. Furthermore, the characteristics of the platinum/iridium devices were found to be very uniform and reproducible from devices-to-devices and wafers-to-wafers.

In the alternate embodiment of FIGS. 4 and 5, a self-guarding Schottky barrier IR detector array is formed in accordance with the invention. As disclosed in U.S. Pat. No. 4,531,055 to Shepherd, Jr., et al., conventional guard rings can be eliminated, provided the Schottky electrodes are closely spaced, so that their depletion regions overlap. In this embodiment, a layer 42 of SiO₂ is formed on a p-Si substrate 40. Openings are formed in the Si)₂ layer, where a mosaic of square or rectangular Schottky barrier electrodes 52 are to be formed between SiO₂ separators 42 (See FIG. 5). Successive layers of Pt 48 and Ir 50 are formed over the top surface [FIG. 4(b)]. The structure of FIG. 4(b) is heat-treated to form an iridium/platinum silicide bi-layer 52 and dry-etched to remove the bi-layer over the SiO₂ separators, leaving a mosaic of platinum silicide/iridium silicide Schottky electrodes 52, with all the advantages previously noted in connection with FIG. 2, plus the elimination of the guard ring structure.

In order to complete the detector array of FIG. 4, it may be preferable to couple each detector cell to a cavity structure consisting of a dielectric layer 42, such as SiO₂, and an aluminum metal contact/reflector structure 46 extending over the silicide region, as shown in FIG. 6. The aluminum 46 serves as a combination light reflector and contact region. The silicon substrate p+ contact 47 is preferably formed on the periphery of the detector array to minimize obstruction of the receiving back-side illuminating light (See arrows in FIG. 6).

In summary, a new fabrication process has been described for the fabrication of high performance iridium/silicide Schottky IR detectors. The procedure described is compatible with conventional silicon processing leading to high reproducibility and ease in manufacturing. The procedure yields improved detector wavelength response and improved quantum efficiency and should, therefore, be very useful for large scale fabrication of high performance IR detector arrays.

Equivalents

This completes the description of the preferred embodiments of the invention. Those skilled in the art may recognize many variations thereof. The invention should not be limited except as required by the scope of the following claims and equivalents thereof. For example, the term guard "ring", as used herein, is not meant to be limited to a circular configuration and is used in the art to refer to square or rectangular mosaic structures, as well. (See, for example. FIG. 2 of the '055 patent.) Also, it is contemplated that silicides of other near nobel metals, having characteristics similar to Pt, may be used in place of the Pt to form silicides. For example, nickel or palladium may be substituted for Pt in the embodiments described.

What is claimed is:

1. A method of forming a detector comprising the steps of:

(a) forming an Si substrate;

(b) forming an insulating layer over said substrate;

(c) forming openings in said layer to said substrate, said openings being laterally surrounded by said insulator;
(d) forming a first layer of a metal from the group comprising Pt, Ni, Pd on the structure formed in step (c);
(e) forming a second layer of the metal Ir on the first layer;
(f) heat treating said structure to form silicides of said metals in said substrate, at said openings; and
(g) removing portions of said metal layers over said surrounding insulator.

2. A method of forming a detector comprising the steps of:
(a) forming an Si substrate;
(b) forming an insulating layer over said substrate;
(c) forming openings in said layer to said substrate, said openings being laterally surrounded by said insulator;
(d) forming a first layer of a metal from the group comprising Pt, Ni, Pd on the structure formed in step (c);
(e) forming a second layer of the metal Ir on the first layer;
(f) removing portions of said first and second layers over the insulator surrounding the openings; and
(g) heat treating said structure to form silicides of said metals in said substrate, at said openings.

3. The method of claim 1 wherein n-type guard ring regions are formed in said Si substrate around the edges of said opening.

4. The method of claim 2 wherein n-type guard ring regions are formed in said Si substrate around the edge of said opening.

5. A method of forming an infrared-light sensitive detector on a Si substrate comprising the steps of:
(a) forming a bounded region of an n-type dopant in a p-type doped substrate thereby forming a structure comprised of p-type doped regions separated by n-type doped guard ring regions;
(b) forming an insulating layer over said structure;
(c) forming openings in said insulating layer to a surface of said substrate, which openings extend to at least a substantial portion of the guard ring regions;
(d) forming successive layers of a material from the group comprising Pt, Ni, Pd then Ir over the structure formed in step (c);
(e) removing portions of said successive layers over said guard ring regions;
(f) heat treating the structure formed in step to produce silicide regions in said substrate, at said openings.

6. A method of forming an infrared-light sensitive detector on a Si substrate comprising the steps of:
(a) forming a bounded region of an n-type dopant in a p-type doped substrate thereby forming a structure comprised of islands of p-type doped regrons separated by n-type doped guard ring regions;
(b) forming an insulating layer over said structure;
(c) forming openings in said insulating layer to a surface of said substrate, which openings extend to at least a substantial portion of the guard ring regions;
(d) forming successive layers of a material from the group comprising Pt, Ni, Pd then Ir over the structure formed in step (c);
(e) heat treating the structure formed in step (d) to produce silicide regions in said substrate at said openings;
(f) removing portions of said successive layers over said guard ring regions.

7. An infrared detector comprised of a region formed of a silicide of Ir and a silicide of Pt, Ni, or Pd, formed in a p-type doped Si substrate with an insulator encircling said region.

8. The detector of claim 11 including an n-type guard region beneath said insulator.

9. The method of claim 1 wherein the first layer of metal is formed of about 5 Å thick film of Pt.

10. The method of claim 2 wherein the first layer of metal is formed of about 5 Å thick film of Pt.

11. The method of claim 9 wherein the heat treatment occurs at a temperature between 300° C.–600° C.

12. The method of claim 14 wherein the heat treatment occurs at a temperature between. 300° C.–600° C.

13. The method of claim 1 wherein the metal layer portions are removed by dry etching.

14. The method of claim 2 wherein the metal layer portions are removed by dry etching.

15. An infrared-light sensitive detector formed of a metallic electrode formed in a p-type substrate and encircled on one side by an insulator, said electrode being comprised of a bi-layer of Pt silicide and Ir silicide, or a mixture of said silicides.

16. The detector of claim 15 including an n-type silicon guard ring about said electrode.

17. An infrared-light sensitive detector formed by the following process:
(a) forming an Si substrate;
(b) forming an insulating layer over said substrate;
(c) forming openings in said layer to said substrate, said openings being laterally surrounded by said insulator;
(d) forming a first layer of a metal from the group comprising Pt, Ni, Pd on the structure formed in step (c) to dissolve any interfacial contaminants or natuve oxides on said substrate;
(e) forming a second layer of the metal Ir on the first layer;
(F) heat treating said structure to form silicides of said metals in said substrate, at said openings; and
(g) removing portions of said metal layers over said surrounding insulator.

18. An infrared-light sensitive detector formed by the following process.
(a) forming an Si substrate;
(b) forming an insulating layer over said substrate;
(c) forming openings in said layer to said substrate, said openings being laterally surrounded by said insulator;
(d) forming a first layer of a metal from the group comprising Pt, NI, Pd on the structure formed in step (c);
(e) forming a second layer of the metal Ir on the first layer;
(f) removing portions of said first and second layers over the insulator surrounding the openings; and
(g) heat treating said structure to form silicides of said metals in said substrate, at said openings.

19. An infrared-light sensitive detector formed by the following process:
(a) forming a bounded region of an n-type dopant in a p-type doped substrate thereby forming a structure comprised of p-type doped regions separated by n-type doped guard ring regions;
(b) forming an insulating layers over said structure;
(C) forming openings in said insulating layer to a surface of said substrate, which openings extend to at least a substantial portion of the guard ring regions;
(d) forming successive layers of a material from the group comprising Pt, Ni, Pd then Ir over the structure formed in step (c);
(e) removing portions of said successive layers over said guard ring regions;
(f) heat treating the structure formed in step (e) to produce silicide regions in said substrate, at said openings.

20. An infrared-light sensitive detector formed by the following process:
(a) forming a bounded region of an n-type dopant in a p-type doped substrate thereby forming a structure comprised of islands of p-type doped regions separated by n-type doped guard ring regions;
(b) forming an insulating layer over said structure;
(c) forming openings in said insulating layer to a surface of said substrate, which openings extend to at least a substantial portion of the guard ring regions;
(d) forming successive layers of a material from the group comprising Pt, Ni, Pd then Ir over the structure formed in step (c) ;
heat treating the structure formed in step (d) to produce silicide regions in said substrate at said openings;
(f) removing portions of said successive layers over said guard ring regions.

21. The method of claim 1 wherein the first layer is in the order of 5 Å thick.

22. The method of claim 1 wherein the first and second layers form a low-barrier height contact to said substrate.

* * * * *

UNITED STATES PATENT AND TRADEMARK OFFICE
CERTIFICATE OF CORRECTION

PATENT NO. : 4,864,378

DATED : September 5, 1989

INVENTOR(S) : Bor-Yeu Tsaur

It is certified that error appears in the above-identified patent and that said Letters Patent is hereby corrected as shown below:

Col. 5, line 52, after "step" insert ---(e)---.

Col. 5, line 59, delete "regrons" and insert ---regions---.

Col. 6, line 10, delete "11" and insert ---7---.

Col. 6, line 17, delete "300° C." and insert ---300°C---.

Col. 6, line 18, delete "14" and insert ---10---.

Col. 6, line 19, delete "300° C." and insert ---300°C---.

Col. 6, line 44, delete "(F)" and insert ---(f)---.

Col. 6, line 56, delete "NI" and insert ---Ni---.

Col. 7, line 4, delete "(C)" and insert ---(c)---.

Col. 8, line 10, before "heat" insert ---(e)---.

Signed and Sealed this

Tenth Day of July, 1990

Attest:

HARRY F. MANBECK, JR.

Attesting Officer

Commissioner of Patents and Trademarks